United States Patent [19]

McBride, Jr. et al.

[11] 4,225,213

[45] Sep. 30, 1980

[54] CONNECTOR APPARATUS

[75] Inventors: Lyle E. McBride, Jr., Norton; Richard G. Delagi, Sharon, both of Mass.

[73] Assignee: Texas Instruments Incorporated, Dallas, Tex.

[21] Appl. No.: 863,758

[22] Filed: Dec. 23, 1977

[51] Int. Cl.$^2$ .............................................. H01L 31/12
[52] U.S. Cl. .............................. 350/96.20; 250/227; 357/18; 357/72; G02B 5/14;
[58] Field of Search .................. 350/96.10, 96.20; 250/227, 239, 552; 357/17, 18, 72, 74

[56] References Cited

U.S. PATENT DOCUMENTS

| 3,509,561 | 4/1970 | Moore et al. | 250/227 |
| 3,757,127 | 9/1973 | Dhaka | 250/239 X |
| 3,963,920 | 6/1976 | Palmer | 350/96.10 X |
| 3,987,300 | 10/1976 | Palmer | 250/227 |
| 4,046,454 | 9/1977 | Pugh | 350/96.21 |
| 4,079,404 | 3/1978 | Comerford et al. | 357/18 |

OTHER PUBLICATIONS

H. Schmid "Fiber-Optic Data Transmission: A Practical, Low Cost Technology" Electronic, Sep. 2, 1976, pp. 94-99.
D. Stigliani "Optical Fibers for Data Transmission", Digital Design May 1976, pp. 48-52.
J. D. Crow "GaAs Laser Array Source Package" Optical Letters vol. 1, No. 1 Jul. 1977, pp. 40-42.
"An Introduction to Communication Fiber Optics Design". Bulletin by Valter Corp. 1977.

*Primary Examiner*—Rolf G. Hille
*Attorney, Agent, or Firm*—John A. Haug; James P. McAndrews

[57] ABSTRACT

A connector assembly comprises a lead frame mounting one or more semiconductor chips, having optically active areas, a fiber guide and optical fibers held in optical communication with the chips. The fiber guide is formed of a plate like member having two or more reference points, in order to precisely locate the fibers relative to the chip. Several embodiments of the guide are shown including a plate having fiber receiving bores extending therethrough as well as a plate having fiber receiving grooves extending along sides thereof preferably used in conjunction with a bar biased against fibers disposed in the grooves. The bar, which may be made of elastomeric material is shown having a straight edge facing the grooves while a variation of the bar is provided with an additional set of grooves. The lead frame mounts a relatively large thermally and electrically conductive pad which in turn mounts the semiconductor chip having optically active areas. Fibers are trained through respective bores or grooves and epoxied in alignment with respective optically active areas. The connector is adapted to be mounted on one side of a backplane while the electronic components such as drivers and amplifiers, associated with matching electrical characteristics of transmitting and receiving circuitry to those of the photo emitting and detecting elements of the chip are mounted on a second side of the backplane. A single connector may contain either or both photo emitting and photo detecting elements.

15 Claims, 6 Drawing Figures

CONNECTOR APPARATUS

This application relates generally to connectors and more specifically to apparatus for interfacing between electronic circuit modules and optical fibers.

Use of optical fibers is becoming more and more widespread in view of the many advantages they offer. For instance, due to their wide band width transmission capability a single fiber can carry the equivalent of thousands of telephone conversations at a given time. With regard to data transmission they offer immunity to electromagnetic interference (EMI) and radio frequency interference (RFI), have inherent non radiation characteristics and are electrical insulators. Problems such as grounding, cross talk and short arcing can be eliminated using such fibers. Size also is an advantage. By way of example for the same information carrying capacity a fiber optic cable having a diameter of 30 mils can replace copper wire pairs having a bundle diameter of three inches. However this decrease in size over conventional copper wire also produces a problem, that of effectively and efficiently handling the fibers. Use of fiber optics entails mechanical precision problems. That is, in order to effectively utilize fiber optics light must be transmitted from a source within an acceptable range of intensity loss. In general a light source, for example an LED or a laser, is precisely located at the input end of the fiber. Light will enter the end of the fiber within a certain acceptance angle and will continue through the fiber reflecting back and forth from the core interface. The light may be modulated on and off by electronic controls in a desired pattern and is received at the output end by a photo detector. This light path is fraught with losses including losses at the LED or laser, at the input into the cable and the output out of the cable and through the detector that converts the light impulses into electronic signals. Thus the means for positioning the fiber ends relative to the light source and the detector are very critical.

It is an object of this invention to provide and improved connector for interfacing between electronic circuit modules and optical fibers while minimizing light loss. Another object is the provision of electronic and fiber optic interfacing means which has wide flexibility in use, facilitates maintenance, is easily interconnected with electronic modules yet one that is simple and reliable. Other objects and features will be in part apparent and in part pointed out hereinafter.

Briefly, in accordance with the invention the interface apparatus comprises a lead frame having a plurality of electrically conductive legs with a relatively large electrically and thermally conductive pad mounted on a distal end of at least one of the legs, at least one semiconductor chip having optically active areas mounted on the pad with respective legs of the lead frame electrically connected to bonding pads on the chip, a guide plate having bores or grooves precisely located relative to the chip, and optical fibers trained through the bores or grooves and held against the optically active areas of the chip by means of epoxy. The entire assembly is potted to produce a solid, one piece connector. The optically active areas include photo emitting and photo receiving elements on the same or separate chips. If on separate chips both may be provided in a single connector or they may be separated into different connectors so that either a transmitter or a receiver is disposed at one end of the fiber optic cable while the other of the two is provided in another connector at the other end of the cable. Stress relief means is preferably provided for the optical cable within the connector to ensure that the position of the fiber ends remains stationary relative to the chip and to prevent transfer of shock or the like to the distal end of the fibers.

BRIEF DESCRIPTION OF THE DRAWINGS

Corresponding reference characters indicate corresponding parts throughout the several views of the drawings.

DESCRIPTION OF PREFERRED EMBODIMENTS

Figure 2:
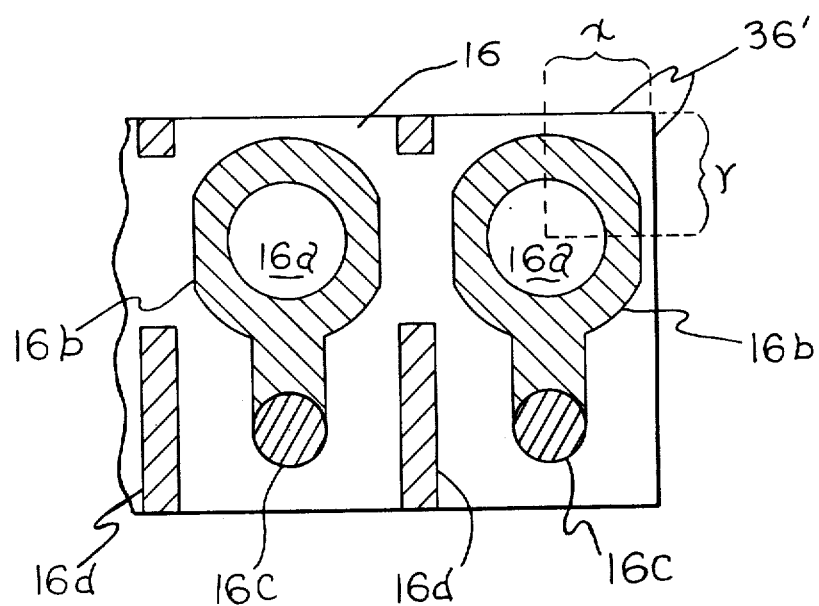
FIG. 2 is a top plan view of a portion of a semiconductor chip used in the FIG. 1 embodiment.

Referring now to the drawings, reference numeral 10 indicates a connector made in accordance with the invention comprising a lead frame 12 including a plurality of electrically conductive terminal members 14a-14n disposed along two columns, first diatal ends bent into a cylindrical configuration 15 to form female sockets although it will be understood that the terminal members could be provided in a pin configuration if desired, and second distal ends bent to lie generally in a plane perpendicular to the axis of the cylinders and directed to a central location within the area defined by the columns. Disposed within the central location are semiconductor chips 16 and 18. As best seen in FIG. 2 chip 16 is provided with a multi-element emitter array in which each element includes emitter area 16a, N-contact metallization 16b and bonding pad 16c. P-contact metallization 16d may be provided on the top of the chip to facilitate probing and testing of the diodes from the top as well as being provided on the bottom thereof. A suitable chip has an emitting area 16a diameter of 8 mils and a center to center emitter spacing of 18 mils. The width of the chip is 27.2 mils, the thickness 11 mils and the length, since chip 16 has six elements, is 105.2 mils. It will be understood that the particular number of elements provided on the chip and hence its length is a matter of choice.

The bonding pads 16c of chip 16 are electrically connected to respective lead frame legs using conventional techniques such as thermo compression bonding of gold wires 20.

Figure 3:
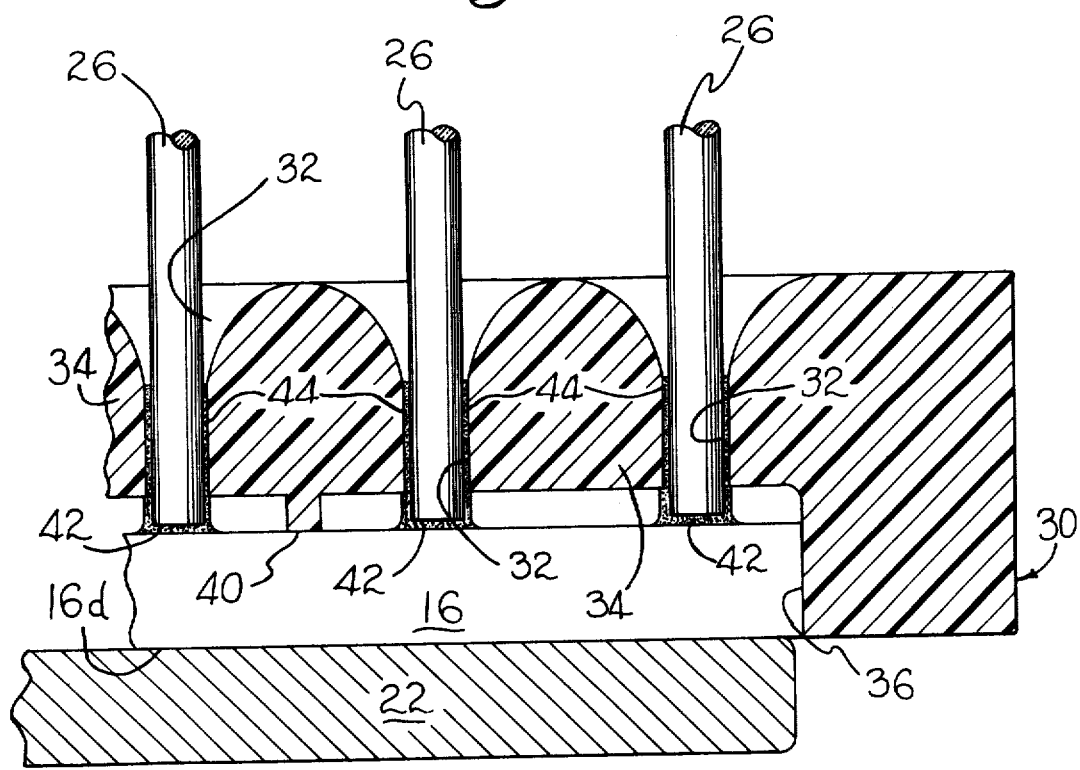
FIG. 3 is a cross sectional view of a portion of the semiconductor chip, fiber optic guide plate with fiber optics epoxied in place and heat sink pad.

Terminal member 14d preferably has its second distal end bent so that it lies in a plane parallel to that formed by the second distal ends of terminal members 14a-14c and 14e-14g but spaced downwardly therefrom in order to accomodate chip 16. The second distal end of terminal member 14d is formed into a relatively massive electrically and thermally conductive pad 22 which is connected by suitable means such as with conductive epoxy, to the P-contact metallization layer 16d on the bottom of chip 16 as best seen in FIG. 3.

A cable 24 comprising a bundle of optical fibers 26 is mounted so that the ends of the fibers are disposed in optical communication with respective emitting areas 16a. Although not shown in FIG. 1 in order to illustrate more clearly the arrangement of the fibers relative to the emitting area and the connection of the chip to the lead frame, a guide plate 30 is employed to precisely locate the fibers. With reference to FIG. 3 a plurality of bores 32 are formed in a single row through top wall 34 of guide plate 30. As seen in the figure the upper portion of the bores are tapered in a smooth curve to facilitate reception of respective fibers. It will be noted that the thickness of wall 34 is significantly greater than the diameter of bores 32 so that the longitudinal axes of the free end portion of the fibers trained through the bores will be held parallel to the axes of the bores. Guideplate 30 is formed with a recess therein to receive chip 16 and is provided with reference points, for example two points located at diametrically opposed corners, one such corner shown in FIG. 3 at 36. Plate 30 is positioned over chip 16 with corner 36' of the chip (FIG. 2) contiguous to corner 36 of the guide plate so that the nearest adjacent emitting area 16a is precisely located relative thereto in both the length (x) and the width (y) direction. Thus the fibers which are trained through apertures 32 are precisely aligned with the emitting areas 16a. Bores 32 are formed so that their axes are perpendicular to the plane in which stop surfaces 40 lie so that the free ends of the fibers will be essentially perpendicular to the top surface of chip 16 to optimize optical coupling between the emitters and the fibers. Stop surface 40, which may be in the form of ribs extending across the plate, are adapted to rest against the chip and serve to locate the bottom surface of the guide plate a selected distance above the chip as well as to provide room for leads 20 which extend through a suitable cut away portion of the side wall of plate 30 and connect the terminal members to the chip. The fibers trained through their respective bores are biased against the chip using their inherent spring characteristics and are fixed in position with clear epoxy which serve as index of refraction matching means to minimize light reflection away from the fiber core. Preferably additional epoxy 44 is placed in the bores 32 to help affix the fibers. Epoxy 42,44 may conveniently be applied by dipping the ends of the fibers into an epoxy bath prior to insertion through the bores in plate 30 or if desired it could be injected in situ.

Semiconductor chip 18 is also mounted on frame 12 adjacent to chip 16. An electrically and thermally conductive pad 23, similar to pad 22 is provided on a distal end of terminal 14k and is bonded to a metallized layer on the back surface (not shown) of chip 18. Chip 18 may be of the same configuration as chip 16 but serves as a detector or receiver while chip 16 serves as an emitter or transmitter. Optical fibers 26 are attached to the photo sensitive areas 18a utilizing another guide plate 30 and additional wires 20 connect bonding pads 18c to terminal members 14h-14j and 14l-14n in the same manner as for chip 16.

The entire assembly is held in a jig and potting material is placed therearound to form a housing 46. Stress relief may be provided for cable 24 by any suitable means such as grommet 50 containing split collar 52 is conjunction with set screw 54. When set screw 54 is tightened cable 24 is firmly held by split collar 52 and grommet 50. Alternatively, cable 24 may be provided with a slight loop within the area to be potted so that after potting scress is applied to the cable will be transferred to the housing.

Figure 1:
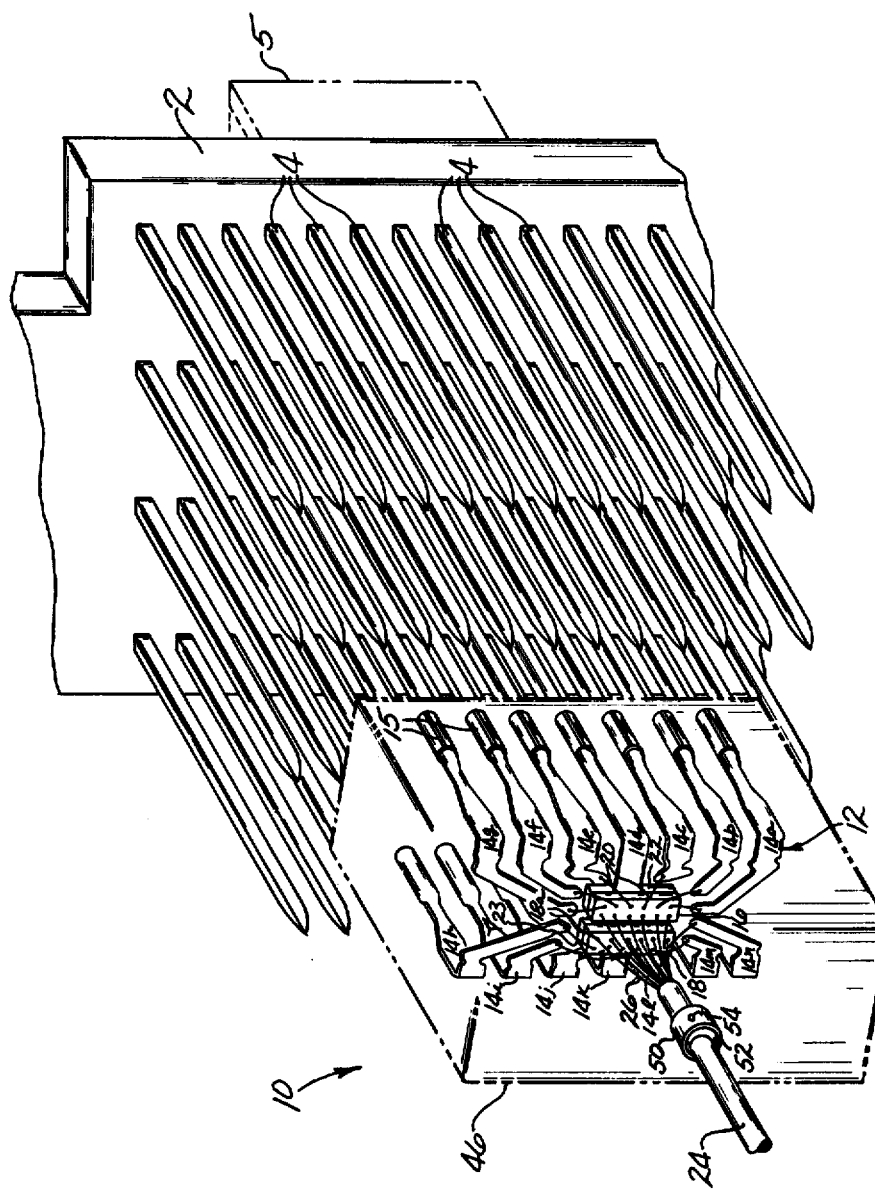
FIG. 1 is a perspective view of a connector made in accordance with a first embodiment of the invention which includes dual chips. The connector is shown with the housing in phantom but without any fiber optic guide plate in order to facilitate illustration.

While separate chips are included in the FIG. 1 embodiment for transmission and reception it will be appreciated that a single chip could be employed having both photo emission and photo reception elements or alternatively it may be preferred to include just the transmitter chip in a connector placed at one end of the fiber optic cable while putting a receiver chip in another connector placed at the other end of the fiber optic cable.

Figure 4:
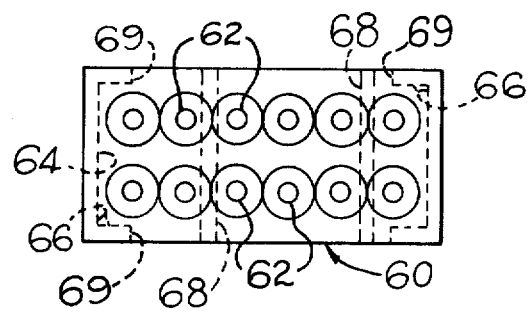
FIG. 4 is a top plan view of a guide plate particularly useful in a connector assembly having a single semiconductor chip with both emitter and receiver elements.
Figure 6:
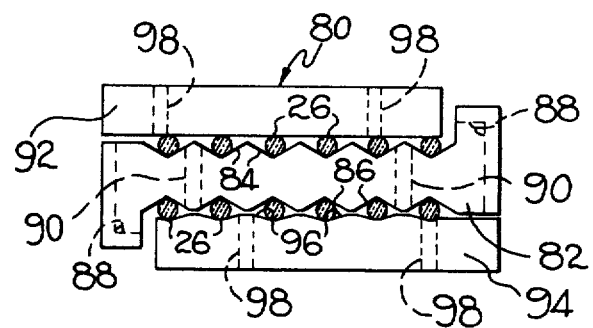
FIG. 6 is a top plan view of another guide plate useful in the FIG. 1 embodiment.

FIGS. 4 and 6 show guide plates which can be used with a double row of fibers. Plate 60 in FIG. 4 has two rows of tapered bores 62 extending from the top to the bottom surface for reception of respective fibers. A recess 64 is formed in the bottom of plate 60 with side walls at diametrically opposed corners 66 serving as indexing means to properly orientate the plate and concomitantly bores 62 relative to the chip received in recess 64. Stop surfaces 68 are provided to position the plate on the chip so that the axes of the bores are perpendicular to the top surface of the chip and to provide room for lead wires 20. The side walls are broken away at 69 to allow passage of wires 20 from the lead frame to the bonding pads of the chip.

Figure 5:
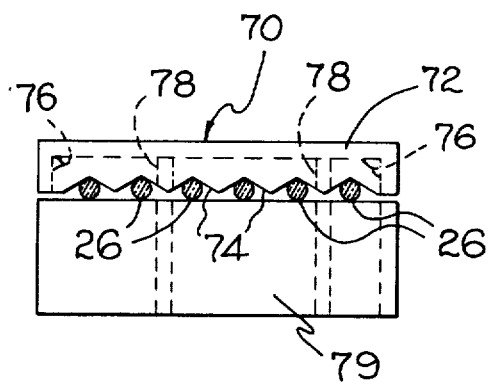
FIG. 5 is a top plan view of a guide plate useful in the FIG. 1 embodiment.

While plate 30, having a single row of bores, and plate 60 having a double row are very effective in locating the fibers in the desired location the guide plates shown in FIGS. 5 and 6 facilitate rapid assembly of the connector. Plate 70 shown in FIG. 5 includes a first body portion 72 in which a row of grooves 74 is formed. Indexing corners 76, in this case on the same side of body portion 72 and stop surfaces 78 are provided as in the guide members of FIGS. 3 and 4 for the same purposes. A second body portion 79 is positioned against fibers 26 precisely locating them in their respective grooves. Body 79 may be composed of elastomeric material to ensure that the fibers are maintained in their proper locations even if there is a misalignment problem which could occur for instance if one fiber were slightly larger than another. Stop surfaces, similar to ribs 78 may be provided or if desired could be eliminated if body 79 is composed of elastomeric material. In assembly, the fibers are merely laid against the row of grooves and smoothed out into the respective grooves. Body portion 72 is indexed onto a suitable chip, body portion 79 is biased against the fibers in the grooves to locate them in the desired location and the assembly is fixed in a conventional jig while a quick setting epoxy is injected into the space between the body pieces and the fibers.

The FIG. 6 embodiment comprises a guide plate assembly 80 comprising a first body portion 82 having a double row of grooves 84, 86, diametrically opposed index corners 88 and stop surfaces 90, again for the same purposes as in the previous embodiments. Second body portion 92 is adapted to be biased against fibers disposed in grooves 84 while third body portion 94 is adapted to be biased against fibers disposed in grooves 86. Ribs 98 may be provided on the bottom surface of the body portions 92 and 94 to provide room for leads 20 extending from the terminal members to the chip or they could be eliminated if desired if elastomeric material is employed for the first and third body portions.

The procedure for assembly of the FIG. 6 embodiment is the same as that of FIG. 5. It will be noted that body piece 94 is provided with a separate row of grooves 96 each aligned with a respective groove in row 86 to more closely enclose the respective fibers. It will be understood that body piece 94 may be provided with a straight edge or alternatively piece 79 of FIG. 5 and 92 and 94 of FIG. 6 may be provided with similar grooves if desired.

A typical use for a connector 10 is illustrated in FIG. 1 which shows a conventional backplane or interconnection device 2 having a plurality of pins 4 extending therefrom. Circuit boards 5 mount thereon various electronic equipment. These boards are mounted on the reverse side of backplane 2 and are connected in any convenient manner, as by wire wrapping techniques utilizing pins 4. Connector 10 is pushed onto selected pins 4 which are received in cylindrical portions 15 of the lead frame 12. The usual electronic components required for matching the electrical characteristics of transmitting and receiving circuitry to those of the photo emitting and detecting elements of the chip including driver and amplifier electronics are located on one such circuit board 5 on the reverse side of backplane 2 where they can be readily tested, serviced and replaced if need be. Thus the connector comprises the portions of the system that require precision mechanical handling contained in a compact efficient package which can be used with any suitable driver and amplifier electronics.

It will be understood that it is within the purview of the invention to employ a laser source which provides a more efficient way of getting light into an optical fiber since the light produced by a laser source is more directional; however, LED's as described in the above embodiments are much less expensive and in most cases can be used as a light source to provide an optical link between two pieces of conventional electronic equipment.

If desired, in certain cases, an amplifier could be included in the connector housing with the receiver portion since the problems in the receiver are largely electrical rather than mechanical. Since the optically active areas of the receiver can easily be made larger than a linking fiber essentially all of the light coming out of the fiber will be utilized. Thus where there is a very low level electrical signal coming out of the receiver, due to light loss between the transmitter and the receiver occasioned by normal attenuation with distance, connecting or splicing required in the line, or otherwise an amplifier chip built into the connector would tend to mitigate noise pickup problems.

In view of the above, it will be seen that the several objects of the invention are achieved and other advantageous results attained.

As various changes could be made to the above constructions without departing from the scope of the invention, it is intended that all matter contained in the above description or shown in the accompanying drawings shall be interpreted as illustrative and not in a limiting sense.

We claim:

1. Apparatus for interfacing between an electronic circuit and optical fibers comprising a housing composed of electrically insulative plastic material having a first side with an aperture therethrough and a second side with at least one row of apertures therethrough, a lead frame mounted in the housing, the lead frame including a plurality of electrically conductive elements having first and second end portions, the first end portion formed into terminal configurations, each terminal configuration aligned with a respective aperture in the second side of the housing, a relatively massive thermally and electrically conductive pad disposed on the second end portion of one of the lead frame elements, a semi-conductor chip bonded to the pad, the chip having a plurality of optical elements, each optical element having a bonding pad, electrically conductive leads connecting each bonding pad with a respective second end portion of the other lead frame elements, a guide plate formed of moldable plastic material overlying the chip, the plate having fiber guiding surfaces formed therein and having indexing surfaces for properly locating the fiber guiding surface relative to the optical elements of the chip, and a cable comprising a plurality of optical fibers extending through the aperture on the first side of the housing with respective fibers received on the fiber guiding surfaces and in optical communication with respective optical elements.

2. Apparatus according to claim 1 in which the guide plate has a top and bottom surface and a plurality of bores extend through the plate from the top to the bottom surface, one of the top and bottom surfaces formed to meet the bores in a tapered surface to facilitate reception of a respective individual optical fiber therethrough.

3. Apparatus according to claim 1 in which stress relief means is provided to prevent dislocation of or cracking of the optical fiber means.

4. Apparatus according to claim 1 in which the said tapered surface is a smooth curve.

5. Apparatus according to claim 1 in which the thickness of the plate from the top surface to the bottom surface is significantly greater than the diameter of the bores.

6. Apparatus according to claim 1 in which a recess is formed in the bottom of the plate, the recess being adapted to receive the chip therein, and stop surfaces extend below the bottom surface of the plate a selected distance in order to provide selected spacing between the chip and the bottom surface of the guide plate.

7. Apparatus according to claim 1 in which a row of grooves are formed in the plate extending from a top surface to a bottom surface of the plate.

8. Apparatus according to claim 7 including a bar element adapted to be biased against fibers received in the grooves to maintain the fibers in their respective selected grooves.

9. Apparatus according to claim 1 in which the optical elements comprise emitter elements and detector elements, and the guide plate has two rows of bores, each bore being adapted to receive therethrough an individual optical fiber, the fibers in one row coupled to respective emitter elements and the fibers in the other row coupled to respective detector elements.

10. Apparatus according to claim 8 in which the bar element is formed of elastomeric material.

11. Apparatus according to claim 1 in which the optical elements comprise emitter elements and detector elements, and the guide plate has two rows of grooves, each groove being adapted to receive therein an individual optical fiber, and two bar elements adapted to be biased against fibers received in the grooves to maintain the fibers in their respective selected grooves, the fibers in one row coupled to respective emitter elements and the fibers in the other row coupled to respective detector elements.

12. Apparatus according to claim 11 which the two bar elements are formed of elastomeric material.

13. Apparatus according to claim 1 in which the optical elements of the semi-conductor chip are photo emitting elements and further including a second semi-conductor chip having photo detector elements disposed in the housing, and optical fibers are positioned in optical communication with the detector elements as well as the emitting elements.

14. Apparatus according to claim 1 in which the terminal configurations comprises female sockets.

15. Apparatus for interfacing between an electronic circuit and optical fibers comprising a housing composed of electrically insulative plastic material having a first side with an aperture therethrough and a second side with at least one row of apertures therethrough, a lead frame mounted in the housing, the lead frame including a plurality of electrically conductive elements having first and second end portions, the first end portion formed into generally female shaped terminal configurations, each terminal configuration aligned with a respective aperture in the second side of the housing, a relatively massive thermally and electrically conductive pad disposed on the second end portion of one of the lead frame elements, a semi-conductor chip bonded to the pad, the chip having a plurality of optical elements, each optical element having a bonding pad, electrically conductive leads connecting each bonding pad with a respective second end portion of the other lead frame elements, a guide plate formed of moldable plastic material overlying the chip, the plate having fiber guiding surfaces formed therein and having indexing surfaces for properly locating the fiber guiding surface relative to the optical elements of the chip, a cable comprising a plurality of optical fibers extending through the aperture in the first side of the housing, respective fibers received on the fiber guiding surfaces and biased against respective optical elements in optical communication therewith, and clear epoxy disposed between the fibers and their respective optical elements.

* * * * *